United States Patent [19]

Smith et al.

[11] Patent Number: 5,178,051
[45] Date of Patent: Jan. 12, 1993

[54] MAGNETIC PUNCH DIE RETENTION FOR HTCC/LTCC FABRICATION

[75] Inventors: Hal D. Smith, Rancho Palos Verdes; George P. Pelzman, El Segundo, both of Calif.

[73] Assignee: Hughes Aircraft Company, Los Angeles, Calif.

[21] Appl. No.: 809,651

[22] Filed: Dec. 18, 1991

[51] Int. Cl.$^5$ .............................................. B26F 1/14
[52] U.S. Cl. ...................................... 83/685; 83/687; 83/691; 83/698
[58] Field of Search ................. 83/698, 684, 686, 687, 83/685, 691

[56] References Cited

U.S. PATENT DOCUMENTS

| 2,217,560 | 10/1940 | Michon | 83/684 |
| 3,750,502 | 8/1973 | Ball | 83/687 X |
| 3,826,170 | 7/1974 | Jones et al. | 83/698 X |
| 4,233,873 | 11/1980 | Jessen | 83/698 X |

Primary Examiner—Frank T. Yost
Assistant Examiner—Kenneth E. Peterson
Attorney, Agent, or Firm—L. A. Alkov; W. K. Denson-Low

[57] ABSTRACT

Die punch apparatus including an electromagnetic die head core having a plurality of punch die retaining apertures, a plurality of magnetically attractable die punch assemblies respectively retained in the plurality of die retaining apertures, and a receiver plate core having punch receiver assemblies for receiving the punch pins of the punch die assemblies.

4 Claims, 2 Drawing Sheets

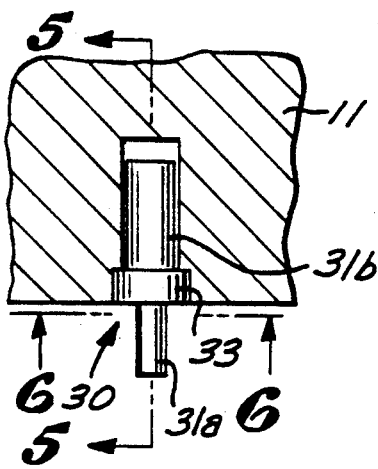
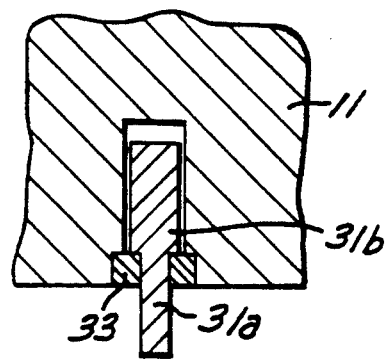
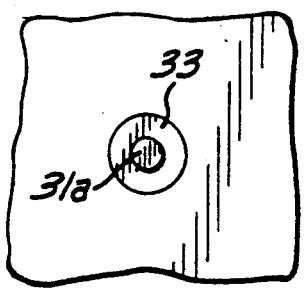
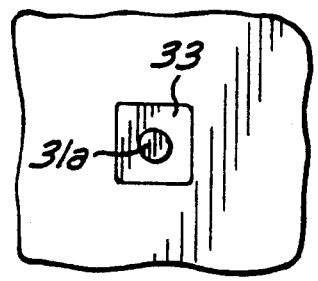
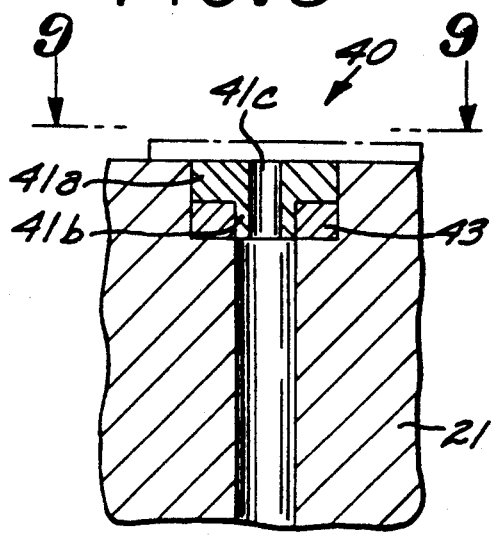
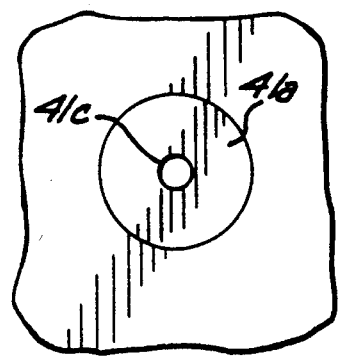

MAGNETIC PUNCH DIE RETENTION FOR HTCC/LTCC FABRICATION

BACKGROUND OF THE INVENTION

The subject invention is directed generally to mechanical punch for use in the manufacture of unitized multi-layer circuit structures, and more particularly to a mechanical punch structure having a punch die retention mechanism that provides for efficient die replacement.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on a insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive material, whereby the conductive material is in contact with predetermined conductive traces between the layers that extend over or under the vias.

Unitized multilayer circuit structures are commonly made pursuant to co-fired technology wherein a unitized multilayer circuit module is made from layers of pyrolyzable dielectric tape (comprising for example a ceramic material) known in the art as "green tape". Generally, each of the green tape layers of a particular module is punched and screen printed to include a predetermined pattern of conductive vias, interconnecting conductive traces, and electrical components such as resistors and capacitors, or portions of capacitors. The individual screen printed green tape layers for a module are then stacked in the required order, and laminated together using a chosen temperature and pressure. The laminated structure is then fired at an elevated temperature. Such co-fired technology has been implemented with low temperature co-fired ceramic (LTCC) as well as with high temperature co-fired ceramic (HTCC).

Examples of low temperature co-fired processing can be found in "Development of a Low Temperature Co-fired Multi-layer Ceramic Technology," by William A. Vitriol et al., 1983 ISHM Proceedings, pages 593-598; "Processing and Reliabilit of Resistors Incorporated Within Low Temperature Co-fired Ceramic Structures," by Ramona G. Pond et al., 1986 ISHM Proceedings, pages 461-472; and "Low Temperature Co-Fireable Ceramics with Co-Fired Resistors," by H. T. Sawhill et al., 1986 ISHM Proceedings, pages 268-271.

The via openings in the green tape layers that constitute a hybrid module are commonly formed by punching with hard tooled punches. Conventional hard tooled punches have been designed to require removal of the punchhead for changing to a different punch configuration, and also for punch die replacement. An important consideration with the requirement of punch- head removal for any changes or repairs thereto is the extensive amount of effort required to minimize registration problems.

SUMMARY OF THE INVENTION

It would therefore be an advantage to provide a via punch structure for use in the manufacture of unitized multilayer circuit structures that allows for efficient replacement of punch dies without removal of the punchhead.

The foregoing and other advantages are provided by the invention in die punch apparatus that includes an electromagnetic die head having a plurality of punch die retaining apertures, a plurality of magnetically attractable die punch assemblies respectively retained in the plurality of die retaining apertures, and a receiver plate having punch receiver assemblies for receiving the punch pins of the punch die assemblies.

BRIEF DESCRIPTION OF THE DRAWINGS

The advantages and features of the disclosed invention will readily be appreciated by persons skilled in the art from the following detailed description when read in conjunction with the drawing wherein:

FIGS. 4 and 5 are partial sectional views illustrating a die punch assembly that can be used in each of die punch retaining openings of the die head of the punch structure of FIG. 2.

FIGS. 6 and 7 are bottom plan views illustrating alternative shapes of the punch retaining collar of the die punch assembly shown in FIGS. 4 and 5.

FIG. 8 is a sectional view illustrating a punch receiver assembly that can be used in each of the receiver retaining apertures of the receiver plate of the punch structure of FIG. 2.

FIG. 9 is a top plan view of the punch receiver assembly of FIG. 8.

DETAILED DESCRIPTION OF THE DISCLOSURE

Figure 1:
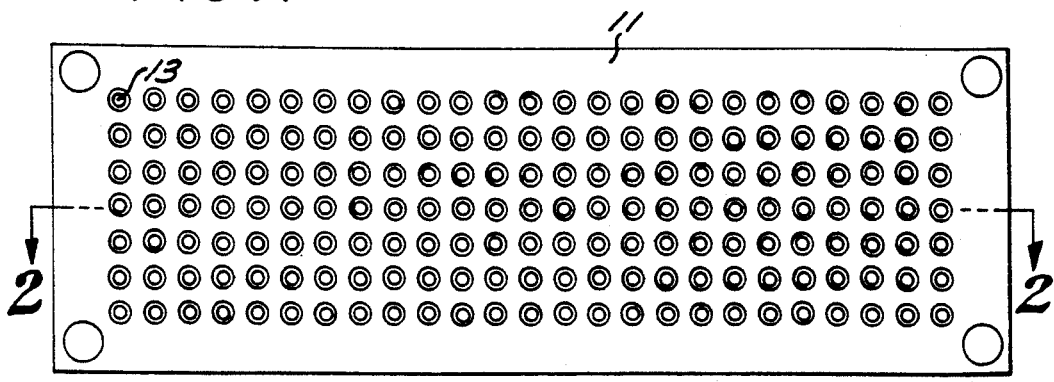
FIG. 1 is a bottom plan view of a die punch head in accordance with the invention illustrating the die punch receiving openings thereof.

In the following detailed description and in the several figures of the drawing, like elements are identified with like reference numerals.

Figure 2:
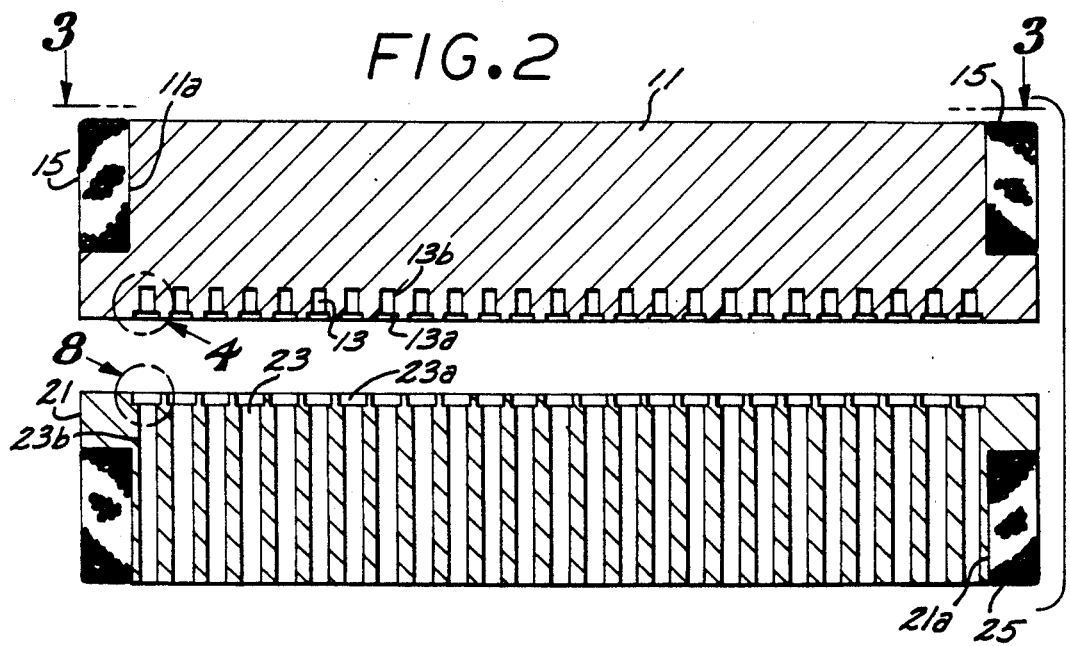
FIG. 2 is an elevational sectional view of a punch structure in accordance with the invention including the punch head of FIG. 1.
Figure 3:
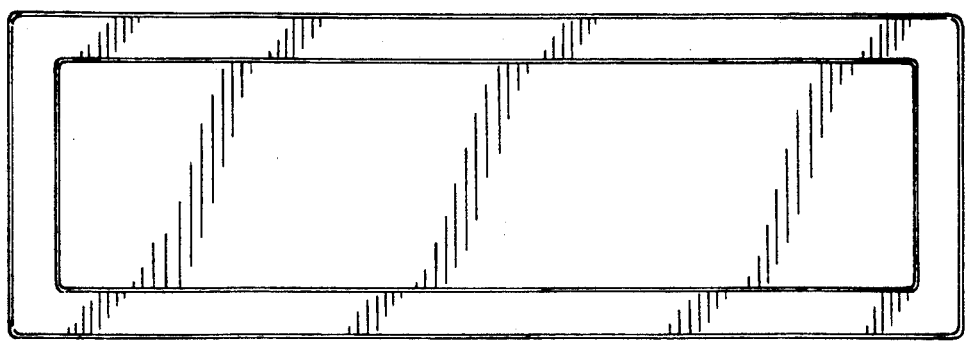
FIG. 3 is a top plan view of the punch head of FIG. 1.

Referring now to FIGS. 1 through 3, schematically depicted therein is a punch structure in accordance with the invention, which for ease of illustration does not show the die punch assemblies 30 (shown in FIGS. 4-7) and the punch receiver assemblies 40 (shown in FIGS. 8 and 9). The punch structure includes die head core 11 having a plurality of countersunk die punch retaining apertures 13 drilled therein. Each aperture 13 is intended to contain a die punch assembly 30 and includes an enlarged terminal portion 13a adjacent the bottom surface of the die head core 11. As shown in FIGS. 6 and 7, the perimeter of the enlarged terminal portion 13a can be circular, or square with rounded corners.

The die head core 11 includes a shoulder cutout 11a around the top portion thereof, and an electrically energizable winding 15 is disposed in the shoulder cutout 11a. The die head core 11 and the winding 15 effectively form an electromagnet which becomes electromagnetic when the winding 15 is energized.

The punch structure further includes a receiver plate core 21 having a plurality of drilled countersunk apertures 23 in concentric alignment with the punch retaining apertures 13 in the die head core 11. Each aperture 23 is configured to contain a punch receiver assembly that conforms to the corresponding die punch contained in the die head core 11 and includes an enlarged terminal portion 23a adjacent the top surface of the receiver plate core 21. The receiver plate core 21 includes a shoulder cutout 21a around the bottom portion thereof, and an electrically energizable winding 25 is disposed in the shoulder cutout 21a. The receiver plate core 21 and the winding 25 effectively form an electromagnet which becomes electromagnetic when the winding 25 is energized.

Referring now to FIGS. 4 and 5, schematically depicted therein is an illustrative example of a die punch assembly 30 that can be utilized in each of the die retaining openings 13 of the die head core 11. The die punch assembly 30 includes a stepped unitary punch comprising a narrow diameter punch pin 31a that is concentrically located on a diametrically larger shaft 31b. The punch shaft 31b is shorter than the depth of the narrow diameter portion 13b of the die punch retaining aperture 13 for which it is intended, with the punch pin 31a corresponding to the desired via opening to be punched.

A retaining collar 33 comprising a magnetically attractable material is press fitted onto the punch pin 31a in abutment with the lower portion of the punch shaft 31b. The retaining collar 33 has a thickness that is substantially the same but not greater that the depth of its intended enlarged terminal aperture portion 13a, and is externally dimensioned for a snug slip fit into the intended enlarged terminal aperture portion 13a with sufficient tightness to maintain the desired concentric alignment of the punch pin 31a with its respective punch receiver plate core aperture 23.

Referring now to FIGS. 8 and 9, schematically illustrated therein is an illustrative example of a typical punch receiver assembly 40 for use in each of the punch receiver retaining apertures 23 of the receiver plate core 21. The punch receiver assembly 40 includes a unitary stepped cylindrical insert in the form of stacked concentric cylinders 41a, 41b of different diameters having a central bore 41c which is configured for the punch pin 31a it is intended to receive.

A magnetically attractable retaining collar 43 is press fitted onto the narrow stepped insert cylinder 41b in abutment with the wide stepped insert cylinder 41a. The outside diameter of the wider stepped insert cylinder 41a is substantially the same as but not greater than the diameter of the retaining collar 43. The retaining collar 43 is externally dimensioned for a snug slip fit into the intended enlarged aperture terminal portion 23a with sufficient tightness to maintain the desired concentricity of the central bore 41c with the corresponding punch pin 31a, and with the top surface of the wide stepped insert cylinder 41a being substantially flush with but not above the top surface of the receiver plate core 21.

The die punch structure of the invention is generally utilized as follows. The die head core 11 and the corresponding receiver plate core 21 are installed in proper alignment in a punch machine (not shown). Punch assemblies 30 are installed in the die punch retaining apertures 13 of the die head core 11, and punch receiver assemblies 40 are installed in the enlarged terminal portions 23a of the retaining apertures 23 of the receiver plate core 21. The installation of punch assemblies 30 and the punch receiver assemblies 40 is performed manually or robotically, for example, with the windings 15, 25 unenergized. The snug fit of the retaining collars 33 and the retaining collars 43 should be sufficient for them to be retained without the need for energizing the windings 15, 25.

When the punch structure is utilized for forming via openings, the windings 15, 25 are energized so that the punch assemblies 30 and the punch receiver assemblies 40 are securely retained in their respective apertures during die operation. Changes or replacements of the punch assemblies 30 and/or punch receiver assemblies 40 are readily performed manually or robotically, for example, with the windings 15, 25 unenergized.

While the receiver plate core 21 has been disclosed as being configured to form an electromagnet with the winding 25, the invention contemplates that the receiver plate core 21 can be a non-electromagnetic structure wherein friction may be sufficient to retain the unitary stepped receiver inserts 41a, 41b during the intended use of the die punch structure. In such case, the retaining collars 43 would not be utilized and the enlarged terminal aperture portions 23a in the receiver plate core 21 would be made shallower.

The foregoing has been a disclosure of a die punch structure which provides for efficient changing of the punch elements without the removal of the die head core or the receiver plate core. Pursuant to the invention, the die head core and the receiver plate core remain in precise alignment since retooling is limited to the removal and insertion of punch assemblies and receiver inserts appropriate to a particular product, and re-registration efforts normally associated with tooling changes are eliminated. By virtue of the ease with which the die punch structure of the invention can be retooled, it is particularly amenable to robotic retooling pursuant to computer database operations.

Although the foregoing has been a description and illustration of specific embodiments of the invention, various modifications and changes thereto can be made by persons skilled in the art without departing from the scope and spirit of the invention as defined by the following claims.

What is claimed is:

1. Die punch apparatus comprising:
   an electromagnetic die head having a plurality of punch die retaining apertures having enlarged terminal portions;
   a plurality of die punch assemblies retained in said plurality of apertures, each of said die punch assemblies including a die punch and a magnetically attractable retaining collar which is dimensioned for a snug slip fit in an enlarged terminal portion such that the die punch assembly is retained in the die retaining aperture without energizing of the electromagnetic die head;
   a receiver plate containing a plurality of receiver insert retaining apertures aligned with the die retaining apertures of said electromagnetic die head; and
   a plurality of receiver inserts retained in said plurality of receiver plate apertures.

2. The die punch apparatus of claim 1 wherein:

said die punch includes a shaft and a narrower punch pin;

said magnetically attractable retaining collar is press fit onto said punch pin and abuts said shaft; and each of said die retaining apertures includes an enlarged terminal portion for accepting said magnetically attractable retaining collar 3. The die punch apparatus of claim 2 wherein said receiver plate comprises an electromagnet, and wherein each of said receiver inserts comprises a magnetically attractable material.

4. Die punch apparatus comprising:

an electromagnetic die head having a plurality of punch die retaining apertures having enlarged terminal portions;

a plurality of die punch assemblies retained in said plurality of apertures, each of said die punch assemblies including a die punch and a magnetically attractable retaining color which is dimensioned for a snug slip fit in an enlarged terminal portion such that the die punch assembly is retained in the die retaining aperture without energizing of the electromagnetic die head;

an electromagntic receiver plate containing a plurality of receiver insert retaining apertures aligned with the die retaining aperture of said electromagnetic die head; and a plurality of receiver inserts retained in said plurality of receiver pate apertures, each of said receiver inserts including a punch receiving bore and a magnetically attractable retaining collar.

* * * * *